US009374046B2

(12) United States Patent
Chang et al.

(10) Patent No.: US 9,374,046 B2
(45) Date of Patent: Jun. 21, 2016

(54) CURRENT AMPLIFIER AND TRANSMITTER USING THE SAME

(71) Applicant: MediaTek Inc., Hsin-Chu (TW)

(72) Inventors: Wen-Hua Chang, Tainan (TW); Tsung-Yi Chou, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 122 days.

(21) Appl. No.: 13/910,615

(22) Filed: Jun. 5, 2013

(65) Prior Publication Data

US 2014/0361836 A1    Dec. 11, 2014

(51) Int. Cl.
H03F 3/45    (2006.01)
H03F 3/16    (2006.01)
G05F 3/26    (2006.01)

(52) U.S. Cl.
CPC .............. H03F 3/16 (2013.01); H03F 3/45273 (2013.01); G05F 3/26 (2013.01); H03F 2200/84 (2013.01); H03F 2203/45054 (2013.01)

(58) Field of Classification Search
CPC ............. H03F 3/04; H03F 3/45; H03F 3/343; H03F 3/345; H03F 2200/84; H03F 2200/87; H03F 2200/91; H03F 2200/151; H03F 2203/21148; H03F 2203/45054; H03F 2203/45182; G05F 3/26
USPC ......... 326/82; 327/51–53, 108; 330/250, 252, 330/257, 288, 291, 301, 311, 260, 261, 75, 330/87, 89, 98–105, 184, 271, 296, 310; 341/135; 365/185.21; 323/315
See application file for complete search history.

(56) References Cited

U.S. PATENT DOCUMENTS

| 5,451,901 | A  | * | 9/1995  | Welland ........................ 330/133 |
| 7,292,097 | B2 | * | 11/2007 | Taylor ..................... H03F 1/486 330/282 |
| 7,312,662 | B1 |   | 12/2007 | Roo et al. |
| 7,459,895 | B2 | * | 12/2008 | Tokumitsu et al. ........... 323/316 |
| 7,876,158 | B2 | * | 1/2011  | Chow et al. .................... 330/288 |
| 8,791,758 | B1 | * | 7/2014  | Foroudi ...................... 330/252 |
| 2008/0310046 | A1 | * | 12/2008 | Menegoli .............. H03F 1/0227 360/75 |
| 2010/0148871 | A1 | * | 6/2010  | Lee et al. ....................... 330/261 |
| 2010/0330938 | A1 | * | 12/2010 | Yin ............................ 455/127.1 |
| 2013/0082776 | A1 | * | 4/2013  | Sugimoto ............... H03F 1/083 330/254 |

OTHER PUBLICATIONS

Niknejad, Ali; Lecture notes 26, slide 12, EE105 Fall 2007, UC Berkeley.*

(Continued)

Primary Examiner — Steven J Mottola
Assistant Examiner — Hafizur Rahman
(74) Attorney, Agent, or Firm — McClure, Qualey & Rodack, LLP

(57) ABSTRACT

A current amplifier and a transmitter using the same. The current amplifier includes: a first transistor having a gate coupled to a former-stage circuit, a drain coupled to a current source, and a source biased at a constant voltage level; a second transistor having a gate coupled to the current source and having a source and a drain; a first impedance circuit coupled between the gate of the first transistor and the source of the second transistor; and a second impedance circuit coupled between the source of the second transistor and a ground terminal. The current amplifier receives an input current from the former-stage circuit and generates an output current at the drain of the second transistor. Note that no current source is connected to the source of the first transistor.

16 Claims, 8 Drawing Sheets

(56) References Cited

OTHER PUBLICATIONS

Padilla, Ivan, R; "Quiescent Current Control Circuit for Class AB Amplifiers", Ph.D. Thesis submitted to the department of Electrical Engineering of New Mexico State University, Las Cruces, New Mexico, May 2007.*

Gupta, T., et al.; "A Sub-2W 10GBASE-T Analog Front-End in 40nm CMOS Process;" IEEE International Solid-State Circuits Conference; Session 24; 10GBase-T and Optical Frontends; 2012; pp. 410-412.

Gerfers, F., et al.; "A 16-Port FCC-Compliant 10GBASE-T Transmitter and Hybrid with 76dBc SFDR up to 400MHz Scalable to 48 Ports;" IEEE International Solid-State Circuits Conference; Session 24; 10GBase-T and Optical Frontends; 2012; pp. 412-414.

Fan, T.Y., et al.; "A 0 11mm^2 150mW 10G Base-T Transmitter in 28nm CMOS Process;" 2015; pp. 1-4.

* cited by examiner

US 9,374,046 B2

CURRENT AMPLIFIER AND TRANSMITTER USING THE SAME

BACKGROUND OF THE INVENTION

1. Field of the Invention

The present invention relates to current amplifiers and transmitters.

2. Description of the Related Art

Nowadays, the need for high data-rate and long distance transmission is emerging in modern communication systems. As a consequence, a high speed and high linear transmitter is more and more important. A current-steering digital-to-analog converter (DAC) is a good candidate for implementing a high speed and high resolution transmitter, but it is difficult to design a sole current mode DAC to satisfactorily operate with both large output swings and low distortions at high operating frequencies.

BRIEF SUMMARY OF THE INVENTION

Current amplifiers and transmitters using the current amplifiers are disclosed. In the disclosed transmitter, a current amplifier of the disclosure is coupled to a current mode DAC to reduce the output swing of the DAC without affecting the transmission efficiency.

A current amplifier in accordance with an exemplary embodiment of the invention comprises at least two transistors and at least two impedance circuits. The first transistor has a gate coupled to a former-stage circuit, a drain coupled to a current source, and a source biased at a constant voltage level. The second transistor has a gate coupled to the current source and has a source and a drain. The first impedance circuit is coupled between the gate of the first transistor and the source of the second transistor. The second impedance circuit is coupled between the source of the second transistor and a ground terminal. The current amplifier receives an input current from the former-stage circuit and generates an output current at the drain of the second transistor. Note that no current source is connected to the source of the first transistor. Further, in another exemplary embodiment, a transmitter comprising the current amplifier and a single-ended digital-to-analog converter is disclosed. The single output of the single-ended digital-to-analog converter is coupled to the gate of the first transistor of the current amplifier. The design of the transmitter is a single ended design.

In another exemplary embodiment, a current amplifier in a pseudo-differential structure is disclosed, which comprises: at least four transistors and at least four impedance circuits. The first-first transistor has a gate coupled to a positive output terminal of a former-stage circuit, a drain coupled to a first current source, and a source biased at a constant voltage level. The first-second transistor has a gate coupled to the first current source and has a source and a drain. The first-first impedance circuit is coupled between the gate of the first-first transistor and the source of the first-second transistor. The first-second impedance circuit is coupled between the source of the first-second transistor and a ground terminal. The second-first transistor has a gate coupled to a negative output terminal of the former-stage circuit, a drain coupled to a second current source, and a source biased at the constant voltage level. The second-second transistor has a gate coupled to the second current source and has a source and a drain. The second-first impedance circuit is coupled between the gate of the second-first transistor and the source of the second-second transistor. The second-second impedance circuit is coupled between the source of the second-second transistor and the ground terminal. According to the disclosed structure, the current amplifier receives a positive input current and a negative input current from the former-stage circuit at the gate of the first-first transistor and the gate of the second-first transistor, respectively, and generates a negative output current and a positive output current at the drain of the first-second transistor and the drain of the second-first transistor, respectively. Note that no current source is connected to the source of the first-first transistor and no current source is connected to the source of the second-first transistor. Further, in another exemplary embodiment, a transmitter comprising the pseudo-differential current amplifier and a differential digital-to-analog converter is disclosed. The differential digital-to-analog converter has a positive output terminal coupled to the gate of the first-first transistor of the current amplifier and has a negative output terminal coupled to the gate of the second-first transistor of the current amplifier. The transmitter is in a differential structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
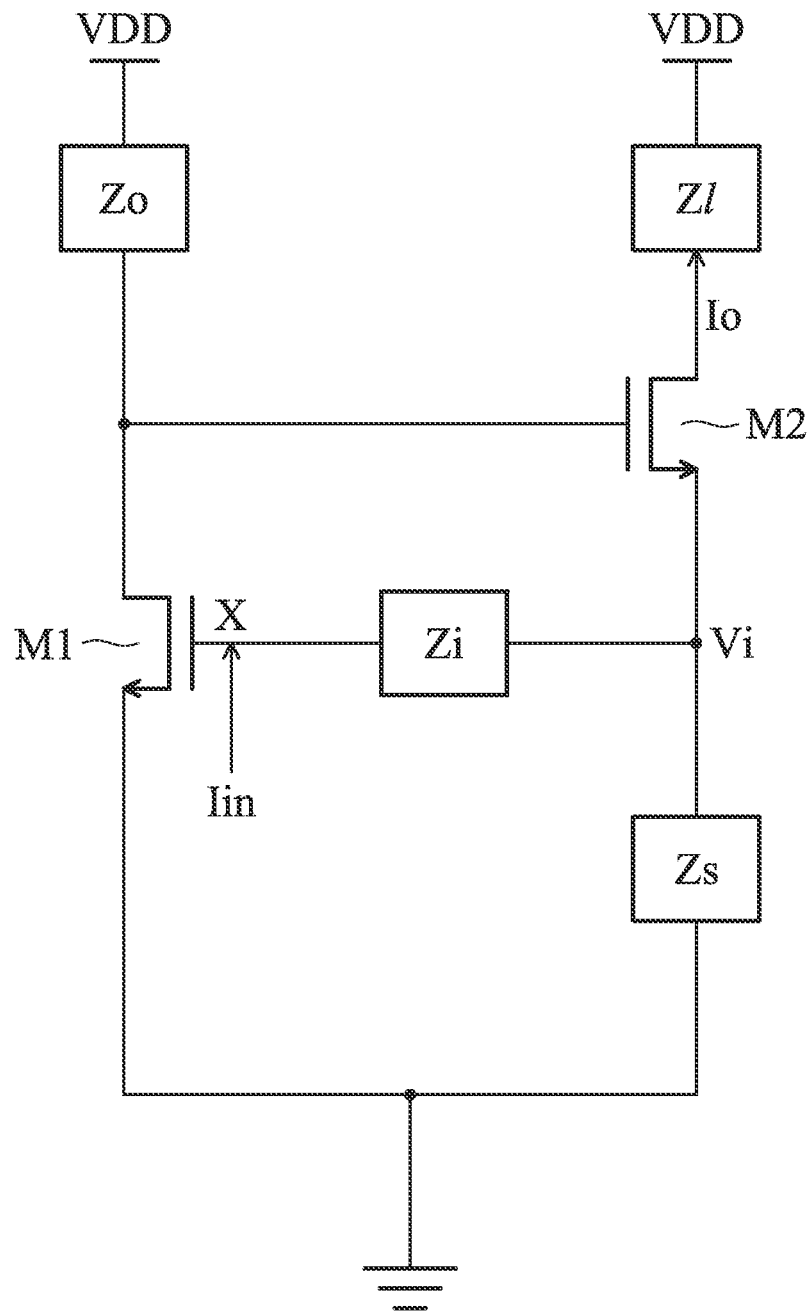
FIG. 1 depicts a current amplifier in accordance with an exemplary embodiment of the invention.

FIG. 1 depicts a current amplifier in accordance with an exemplary embodiment of the invention, which comprises at least two transistors M1 and M2 and at least two impedance circuits Zi and Zs. The transistor M1 has a gate coupled to a former-stage circuit via node X. As shown, the former-stage circuit provides the current amplifier with an input current Iin. Further, the transistor M1 has a drain coupled to a current source (simplified to an impedance element Zo) and has a source biased at a constant voltage level (e.g., ground, but not limited thereto). The transistor M2 has a gate coupled to the current source (Zo) and has a source and a drain. The impedance circuit Zi is coupled between the gate of the transistor M1 and the source of the transistor M2. The impedance circuit Zs is coupled between the source of the transistor M2 and the ground terminal. According to the received input current Iin, the current amplifier generates an output current Io at the drain of the transistor M2. A load impedance Zl may be coupled at the drain of the transistor M2 and thereby the output current Io can be transformed into a voltage value.

The transistors M1 and M2 and the impedance structures Zo, Zi and Zs form a negative feedback loop. Thus, the node X is AC grounded—just a very small AC signal, due to loop gain, exists. Thus, Vi=−Iin*Zi, and Io=(Vi/Zs)−Ii=[(−Ii*Zi)/Zs−Iin]. A current gain, (1+Zi/Zs), between Ii and Io is generated.

Note that no current source is connected to the source of the transistor M1. The voltage level of the source of the transistor M1 is kept constant by a constant voltage bias rather than a common mode bias design. Thus, the disclosed current amplifier works well in single ended applications.

Figure 2:
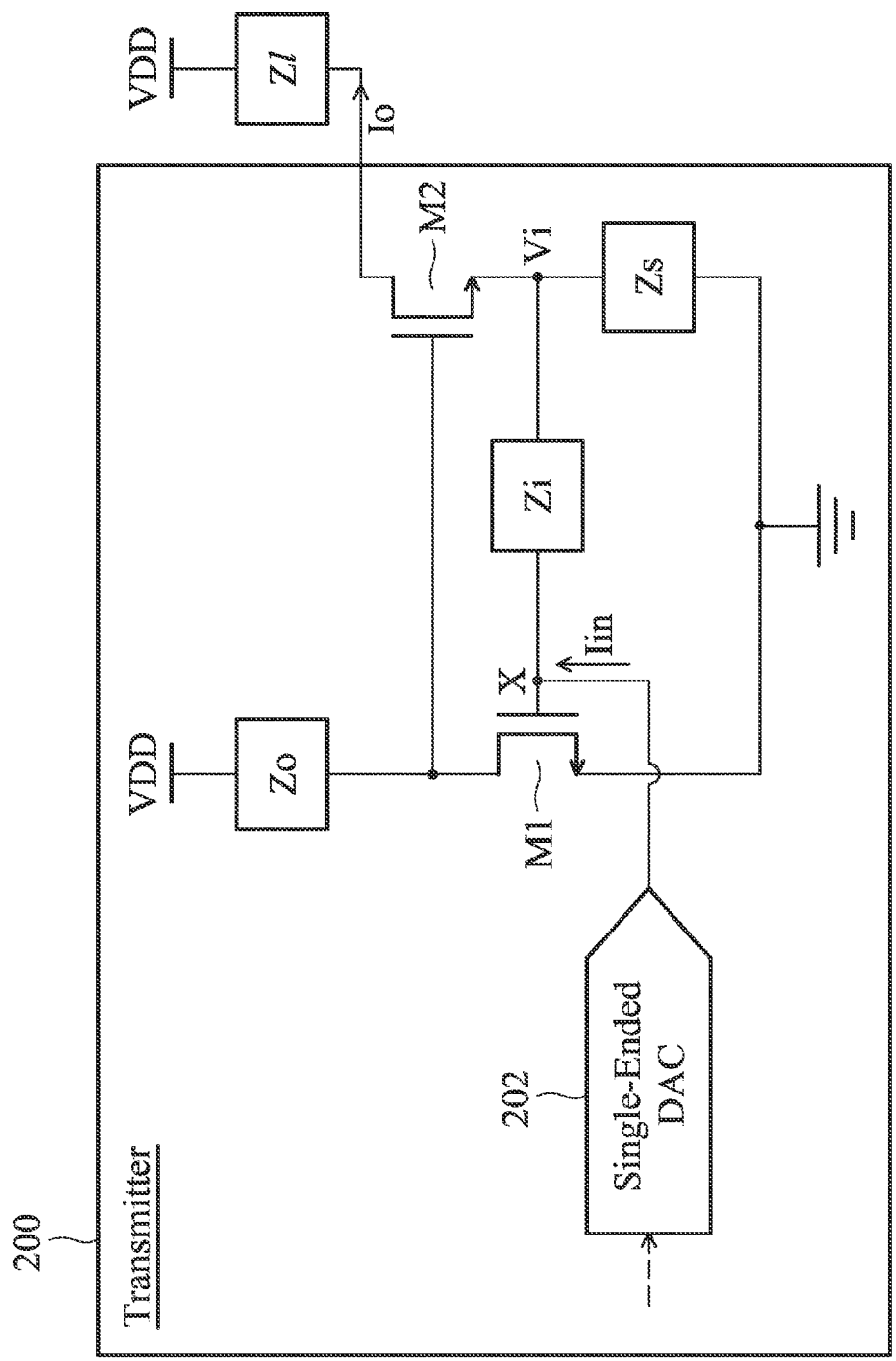
FIG. 2 depicts a single ended design transmitter 200.

FIG. 2 depicts a single ended design transmitter 200. The transmitter 200 comprises the current amplifier of FIG. 1 and a single-ended digital-to-analog converter 202. The single output of the single-ended digital-to-analog converter 202 is coupled to the gate of the transistor M1 of the current amplifier. Via node X, the single-ended digital-to-analog converter 202 provides the current amplified with an input current Iin, and a single output current Io is generated by the current amplifier and coupled to the load impedance Zl for current-to-voltage transformation. When applied to transmission operations, low noise and high bandwidth are achieved by the current amplifier of FIG. 1, because no active device is required at the source of the transistor M1 of the current amplifier.

Figure 3A:
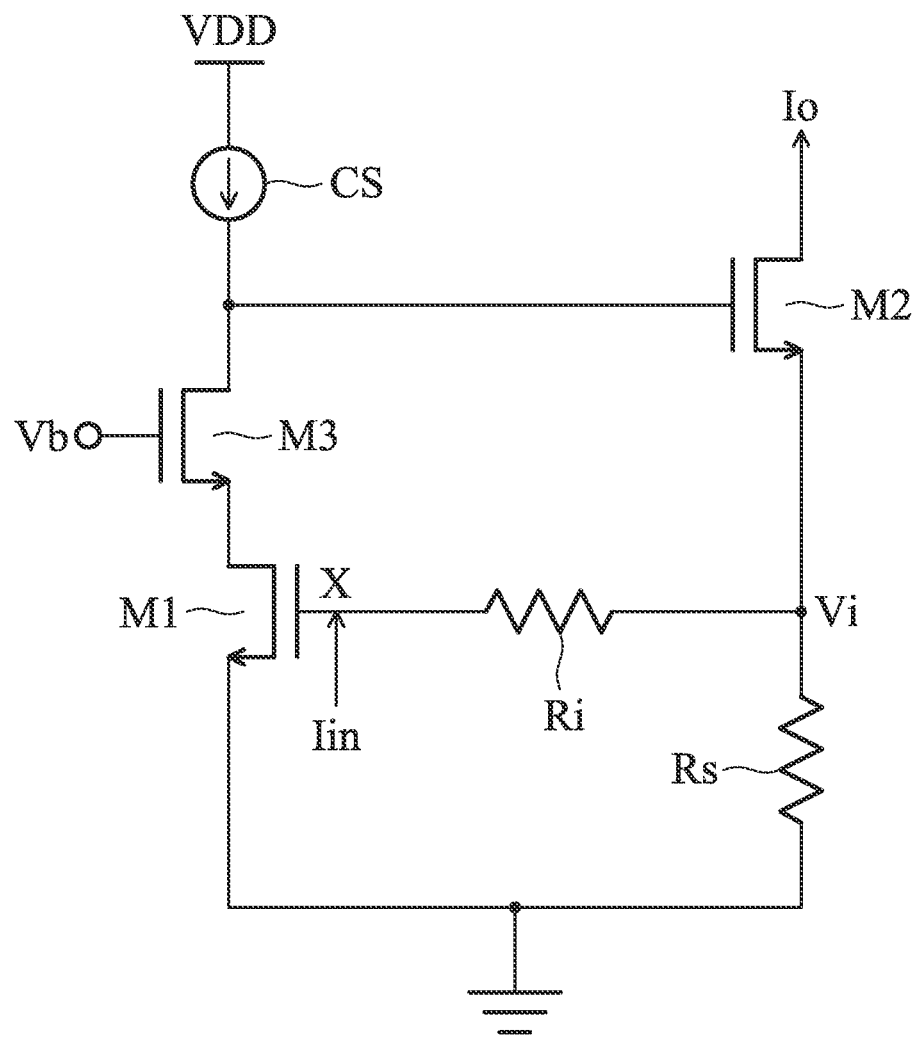
FIGS. 3A to 3C show several current amplifiers, wherein a transistor M3 is provided, having a gate biased at a bias voltage Vb, a source coupled to the drain of the transistor M1, and a drain coupled to the current source CS with the gate of the transistor M2.
Figure 3B:
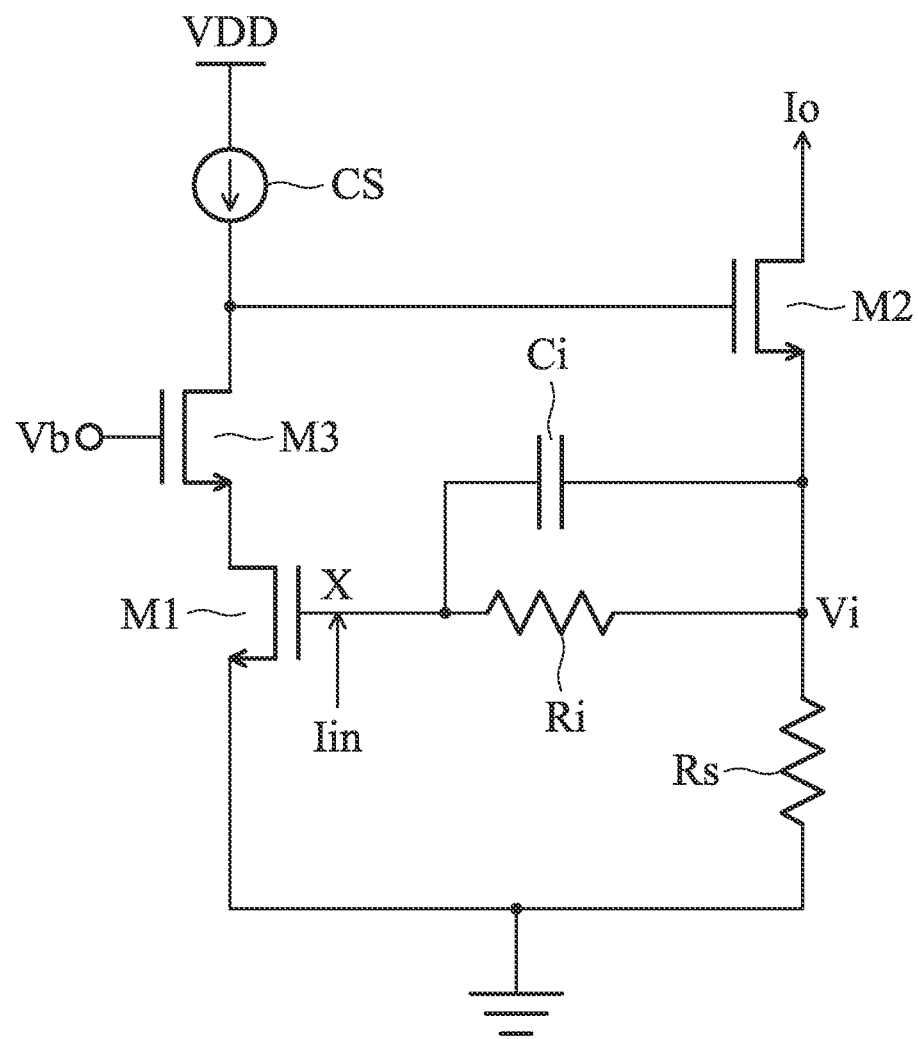
Figure 3C:
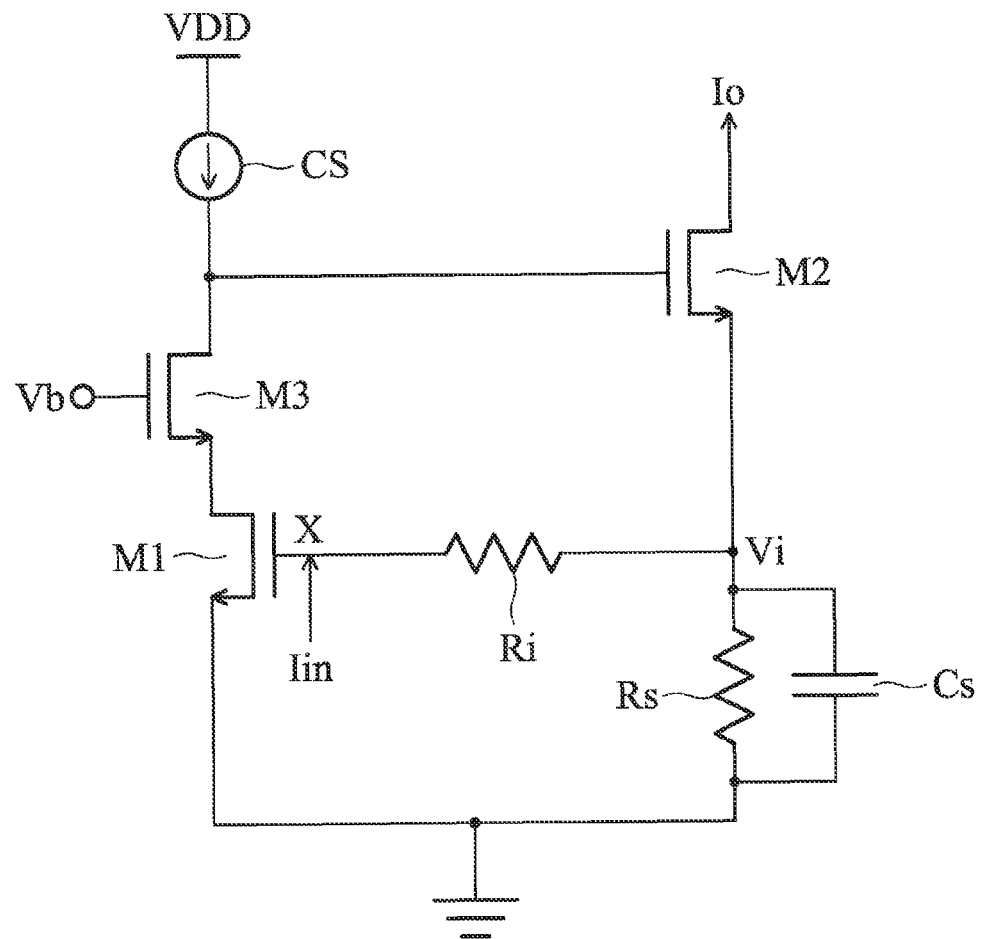

FIGS. 3A to 3C show several current amplifiers in accordance with exemplary embodiments of the disclosure, wherein a transistor M3 is provided, having a gate biased at a bias voltage Vb, a source coupled to the drain of the transistor M1, and a drain coupled to the current source CS with the gate of the transistor M2.

In FIG. 3A, a resistor Ri is coupled between the gate of the transistor M1 and the source of the transistor M2 to implement the impedance circuit Zi of FIG. 1, and a resistor Rs is coupled between the source of the transistor M2 and the ground terminal to implement the impedance circuit Zs of FIG. 1. Because of the feedback network formed by M1, M2, CS, Ri and Rs, the gate voltage of M1 is almost kept constant no matter how much input current Iin is injected into node X. This means that the disclosed current amplifier has small input impedance. The voltage across Ri varies with Iin and Io=−(1+Ri/Rs)*Iin. The current gain of the current amplifier is controllable by changing the resistance of Ri and Rs. The circuit design is much simpler in comparison with the conventional current amplifier requiring additional active devices for common mode bias.

In comparison to FIG. 3A, FIG. 3B further includes a capacitor Ci connected in parallel with the resistor Ri. The parallel connected Ri and Ci form the impedance circuit Zi of FIG. 1, working as a low pass filter.

In comparison to FIG. 3A, FIG. 3C further includes a capacitor Cs connected in parallel with the resistor Rs. The parallel connected Rs and Cs form the impedance circuit Zs of FIG. 1, working as a high pass filter.

Implementation of the impedance circuits of FIG. 3A to FIG. 3C are not intended to limit the scope of the invention. For example, a band pass function may be provided by using a parallel-connected resistor and capacitor, paired to implement the impedance circuit Zi and a parallel-connected resistor and capacitor, paired to implement the impedance circuit Zs.

Further, a pseudo differential current amplifier is disclosed based on the circuit of FIG. 1.

Figure 4A:
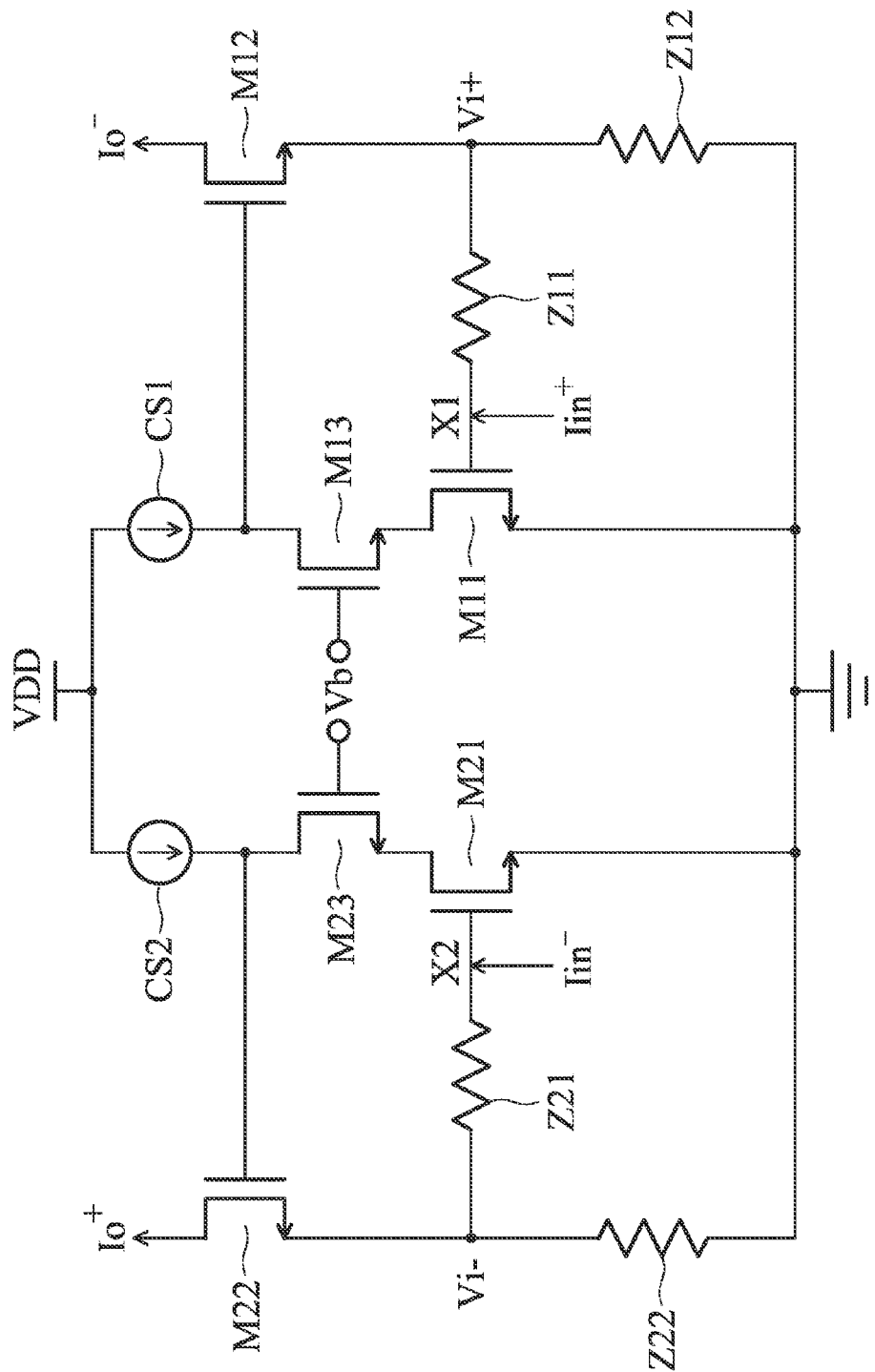
FIG. 4A depicts a current amplifier in a pseudo-differential structure in accordance with an exemplary embodiment of the invention.

FIG. 4A depicts a current amplifier in a pseudo-differential structure in accordance with an exemplary embodiment of the invention. First, the right part of the circuit of FIG. 4A is discussed. The transistor M11 has a gate coupled to a positive output terminal of a former-stage circuit for receiving a positive input current Iin+, a drain coupled to a current source CS1, and a source biased at a constant voltage level (e.g., ground, but not limited thereto). The transistor M12 has a gate coupled to the current source CS1 and has a source and a drain. The impedance circuit Z11 is coupled between the gate of the transistor M11 and the source of the transistor M12. The impedance circuit Z12 is coupled between the source of the transistor M12 and a ground terminal. The transistor M13 is optional, having a gate biased at a bias voltage Vb, a source coupled to the drain of the transistor M11, and a drain coupled to the current source CS1 with the gate of the transistor M12. A negative output current Io− is generated at the drain of the transistor M12.

Next, the left part of the circuit of FIG. 4A is discussed. The transistor M21 has a gate coupled to a negative output terminal of the former-stage circuit for receiving a negative input current Iin−, a drain coupled to a current source CS2, and a source biased at the constant voltage level (as shown, connected at the ground terminal). The transistor M21 has a gate coupled to the current source CS2 and has a source and a drain. The impedance circuit Z21 is coupled between the gate of the transistor M21 and the source of the transistor M22. The impedance circuit Z22 is coupled between the source of the transistor M22 and the ground terminal. The transistor M23 is optional, having a gate biased at the bias voltage Vb, a source coupled to the drain of the transistor M21, and a drain coupled to the current source CS2 with the gate of the transistor M22. A positive output current Io+ is generated at the drain of the transistor M22.

Figure 4B:
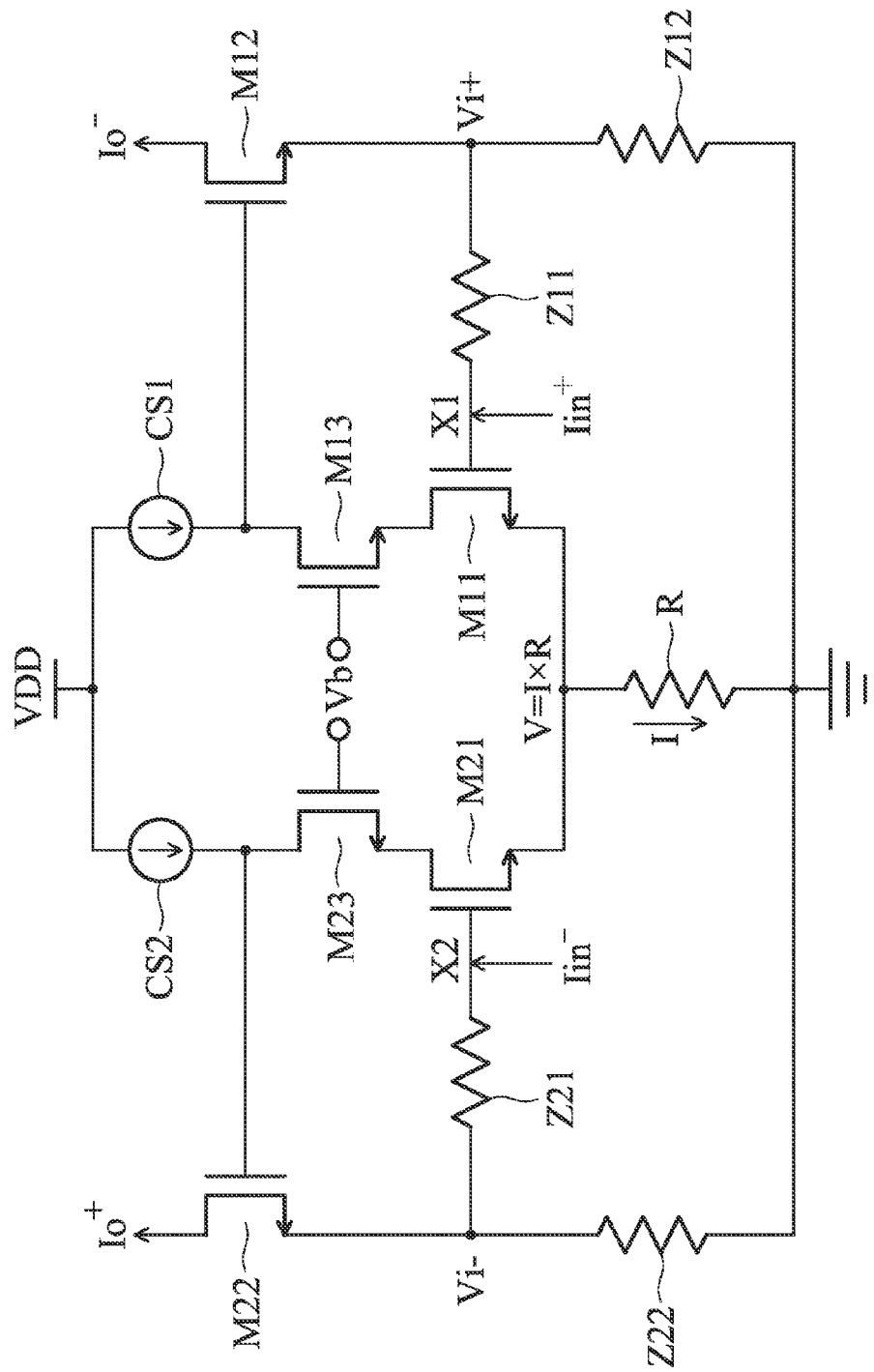
FIG. 4B depicts a current amplifier in a pseudo-differential structure in accordance with another exemplary embodiment of the invention.

FIG. 4B depicts a current amplifier in a pseudo-differential structure in accordance with another exemplary embodiment of the invention. In comparison with the current amplifier of FIG. 4A, the circuit of FIG. 4B further provides a resistor R, coupling the source of the transistor M11 and the source of the transistor M21 to the ground terminal. Thus, the source of the transistor M11 and the source of the transistor M21 are biased at a constant voltage level I*R instead of biasing at the ground level.

The constant voltage level, biasing the source of the transistor M11 and the source of the transistor M21, is not limited to the ground level or the voltage level V (=I*R). Any constant voltage biasing circuit without connecting any current source to the source of the transistor M12 and the source of the transistor M22, is also within the scope of the invention. Because no active device is required at the source of the transistor M11 and the source of the transistor M21, the disclosed pseudo current amplifiers guarantees low noise and high bandwidth when applied to transmission operations.

Figure 5:
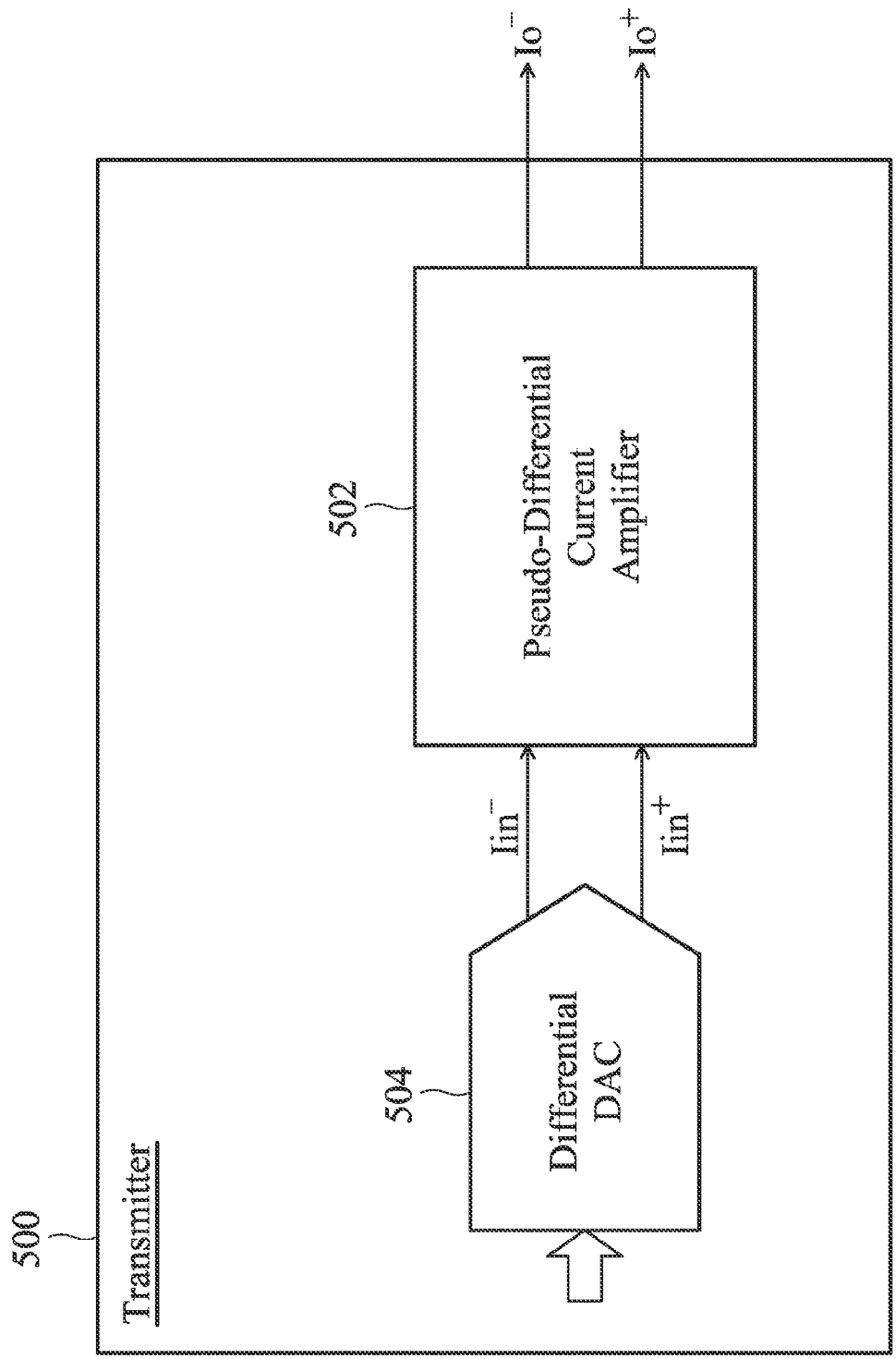
FIG. 5 depicts a transmitter 500 in a differential structure.

In accordance with an exemplary embodiment of the invention, FIG. 5 depicts a transmitter 500 in a differential structure, comprising a pseudo-differential current amplifier 502 and a differential digital-to-analog converter 504. The pseudo-differential current amplifier 502 may be implemented by the circuits of FIG. 4A or FIG. 4B. The differential digital-to-analog converter 504 has a positive output terminal and a negative output terminal providing the pseudo-differential current amplifier 502 with the positive and negative input currents Iin+ and Iin−, respectively.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A current amplifier, comprising:
   a first transistor, having a gate coupled to a former-stage circuit, a drain coupled to a current source, and a source biased at a constant voltage level;
   a second transistor, having a gate coupled to the current source and having a source and a drain;
   a first impedance circuit, coupled between the gate of the first transistor and the source of the second transistor; and
   a second impedance circuit, coupled between the source of the second transistor and a ground terminal,
   wherein the current amplifier receives an input current from the former-stage circuit and an output current is taken from the drain of the second transistor.

2. The current amplifier as claimed in claim 1, wherein no current source is connected to the source of the first transistor.

3. The current amplifier as claimed in claim 1, wherein the source of the first transistor is directly connected to the ground terminal.

4. The current amplifier as claimed in claim 1, wherein the drain of the first transistor is coupled to the current source by a third transistor, and, the third transistor has a gate biased at a bias voltage, a source coupled to the drain of the first transistor, and a drain coupled to the current source with the gate of the second transistor.

5. The current amplifier as claimed in claim 1, wherein the first impedance circuit comprises a resistor, and, the resistor is coupled between the gate of the first transistor and the source of the second transistor.

6. The current amplifier as claimed in claim 5, wherein the first impedance circuit further comprises a capacitor connected in parallel with the resistor.

7. The current amplifier as claimed in claim 1, wherein second impedance circuit comprises a resistor, and, the resistor is coupled between the source of the second transistor and the ground terminal.

8. The current amplifier as claimed in claim 7, wherein the second impedance circuit further comprises a capacitor connected in parallel with the resistor.

9. A transmitter, comprising:
   the current amplifier as claimed in claim 1; and
   a single-ended digital-to-analog converter, having a single output coupled to the gate of the first transistor of the current amplifier.

10. The transmitter as claimed in claim 9, wherein the drain of the second transistor of the current amplifier is coupled to a load impedance and thereby the output current is transformed into an voltage value.

11. A current amplifier, comprising:
    a first-first transistor, having a gate coupled to a positive output terminal of a former-stage circuit, a drain coupled to a first current source, and a source biased at a constant voltage level;
    a first-second transistor, having a gate coupled to the first current source and having a source and a drain;
    a first-first impedance circuit, coupled between the gate of the first-first transistor and the source of the first-second transistor;
    a first-second impedance circuit, coupled between the source of the first-second transistor and a ground terminal,
    a second-first transistor, having a gate coupled to a negative output terminal of the former-stage circuit, a drain coupled to a second current source, and a source biased at the constant voltage level;
    a second-second transistor, having a gate coupled to the second current source and having a source and a drain;
    a second-first impedance circuit, coupled between the gate of the second-first transistor and the source of the second-second transistor;
    a second-second impedance circuit, coupled between the source of the second-second transistor and the ground terminal,
    wherein the current amplifier receives a positive input current and a negative input current from the former-stage circuit at the gate of the first-first transistor and the gate of the second-first transistor, respectively, and generates a negative output current and a positive output current at the drain of the first-second transistor and the drain of the second-first transistor, respectively.

12. The current amplifier as claimed in claim 11, wherein no current source is connected to the source of the first-first transistor and no current source is connected to the source of the second-first transistor.

13. The current amplifier as claimed in claim 11, wherein the source of the first-first transistor and the source of the second-first transistor are directly connected to the ground terminal.

14. The current amplifier as claimed in claim 11, further comprising:
    a resistor, coupling the source of the first-first transistor and the source of the second-first transistor to the ground terminal.

15. The current amplifier as claimed in claim 11, wherein:
    the drain of the first-first transistor is coupled to the first current source by a first-third transistor, and, the first-third transistor has a gate biased at a bias voltage, a source coupled to the drain of the first-first transistor and a drain coupled to the first current source with the gate of the first-second transistor; and
    the drain of the second-first transistor is coupled to the second current source by a second-third transistor, and, the second-third transistor has a gate biased at the bias voltage, a source coupled to the drain of the second-first transistor and a drain coupled to the second current source with the gate of the second-second transistor.

16. A transmitter, comprising:
    the current amplifier as claimed in claim 11; and
    a differential digital-to-analog converter, having a positive output terminal coupled to the gate of the first-first transistor of the current amplifier and having a negative output terminal coupled to the gate of the second-first transistor of the current amplifier.

* * * * *